US008319404B2

(12) United States Patent
Takahashi

(10) Patent No.: US 8,319,404 B2
(45) Date of Patent: Nov. 27, 2012

(54) SURFACE-MOUNTABLE QUARTZ-CRYSTAL DEVICES AND METHODS FOR MANUFACTURING SAME

(75) Inventor: Takehiro Takahashi, Saitama (JP)

(73) Assignee: Nihon Dempa Kogyo, Co., Ltd., Tokyo (JP)

( * ) Notice: Subject to any disclaimer, the term of this patent is extended or adjusted under 35 U.S.C. 154(b) by 0 days.

(21) Appl. No.: 13/075,121

(22) Filed: Mar. 29, 2011

(65) Prior Publication Data

US 2011/0241491 A1  Oct. 6, 2011

(30) Foreign Application Priority Data

Mar. 31, 2010  (JP) ................................ 2010-080195

(51) Int. Cl.
- *H01L 41/09* (2006.01)
- *H01L 41/053* (2006.01)
- *H01L 41/047* (2006.01)
- *H03H 9/19* (2006.01)
- *H03H 9/21* (2006.01)

(52) U.S. Cl. ........ 310/348; 310/312; 310/333; 310/344; 310/360; 310/361; 310/365; 310/370

(58) Field of Classification Search ................. 310/312, 310/333, 340, 344, 348, 360, 361, 365, 370
See application file for complete search history.

(56) References Cited

U.S. PATENT DOCUMENTS

| | | | | |
|---|---|---|---|---|
| 4,652,787 A * | 3/1987 | Zingg | ............................ | 310/344 |
| 6,787,970 B2 * | 9/2004 | Shim et al. | .................... | 310/312 |
| 8,138,659 B2 * | 3/2012 | Nakai | ........................... | 310/344 |
| 2007/0228891 A1 | 10/2007 | Tanaya | | |
| 2009/0236941 A1 * | 9/2009 | Nakai | ........................... | 310/340 |

(Continued)

FOREIGN PATENT DOCUMENTS

JP    S62-109415    5/1987

(Continued)

OTHER PUBLICATIONS

Japan Patent Office, Office Action for Japan Patent Application No. 2010-080195, issued May 1, 2012, 8 pages.

(Continued)

*Primary Examiner* — Thomas Dougherty
(74) *Attorney, Agent, or Firm* — Klarquist Sparkman, LLP

(57) ABSTRACT

In an exemplary method for making crystal vibrating devices, four wafers are provided: a crystal wafer, a base wafer, a first-lid wafer, and a second-lid wafer. The crystal wafer defines multiple crystal vibrating pieces including respective frames and respective electrodes formed on both main surfaces thereof. The base wafer defines multiple base plates bondable to one main surface of respective frames. The first-lid wafer defines multiple first lids bondable to the other main surface of the respective frames. Each first lid defines a void registrable with respective electrodes. The second-lid wafer is sized similarly to and bondable to the first-lid wafer so as to sealably close the voids. In a first bonding step the crystal wafer is bonded to the base wafer and first-lid wafer. In a subsequent adjustment step the thickness of at least one electrode per each crystal vibrating piece is adjusted to adjust the vibrational frequency of the respective vibrating portion. Thickness adjustment occurs through the respective voids. In a second bonding step, the second-lid wafer is bonded to the first-lid wafer. The resulting wafer sandwich is cut up into individual quartz crystal devices.

9 Claims, 12 Drawing Sheets

U.S. PATENT DOCUMENTS

| | | | |
|---|---|---|---|
| 2010/0117489 A1* | 5/2010 | Takahashi | 310/344 |
| 2011/0316390 A1* | 12/2011 | Umeki et al. | 310/344 |
| 2012/0032561 A1* | 2/2012 | Mizusawa et al. | 310/344 |
| 2012/0068578 A1* | 3/2012 | Takahashi | 310/344 |
| 2012/0098390 A1* | 4/2012 | Takahashi | 310/348 |
| 2012/0139391 A1* | 6/2012 | Mizusawa et al. | 310/344 |
| 2012/0169182 A1* | 7/2012 | Mizusawa et al. | 310/348 |
| 2012/0176004 A1* | 7/2012 | Mizusawa et al. | 310/348 |

FOREIGN PATENT DOCUMENTS

| | | |
|---|---|---|
| JP | H6-224677 | 8/1994 |
| JP | H08-293753 | 11/1996 |
| JP | H9-331228 | 12/1997 |
| JP | 10-284971 | 10/1998 |
| JP | 2000-223996 | 8/2000 |
| JP | 2001-196889 | 7/2001 |
| JP | 2001-267875 | 9/2001 |
| JP | 2006-157369 | 6/2006 |
| JP | 2006-311393 | 11/2006 |
| JP | 2007-258918 | 10/2007 |
| JP | 2007-274104 | 10/2007 |
| JP | 2010-041550 | 2/2010 |

OTHER PUBLICATIONS

Office Action for related Japan Patent Application No. 2010-080195, 4 pages, dated Sep. 4, 2012 (in Japanese; new references listed on p. 3 thereof).

* cited by examiner

Fig 5A
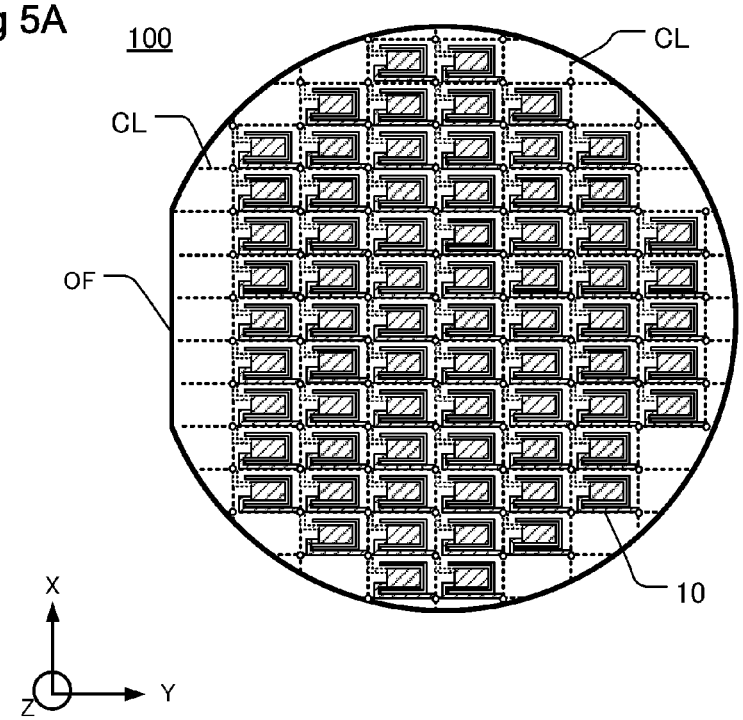
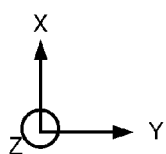
Fig 5B
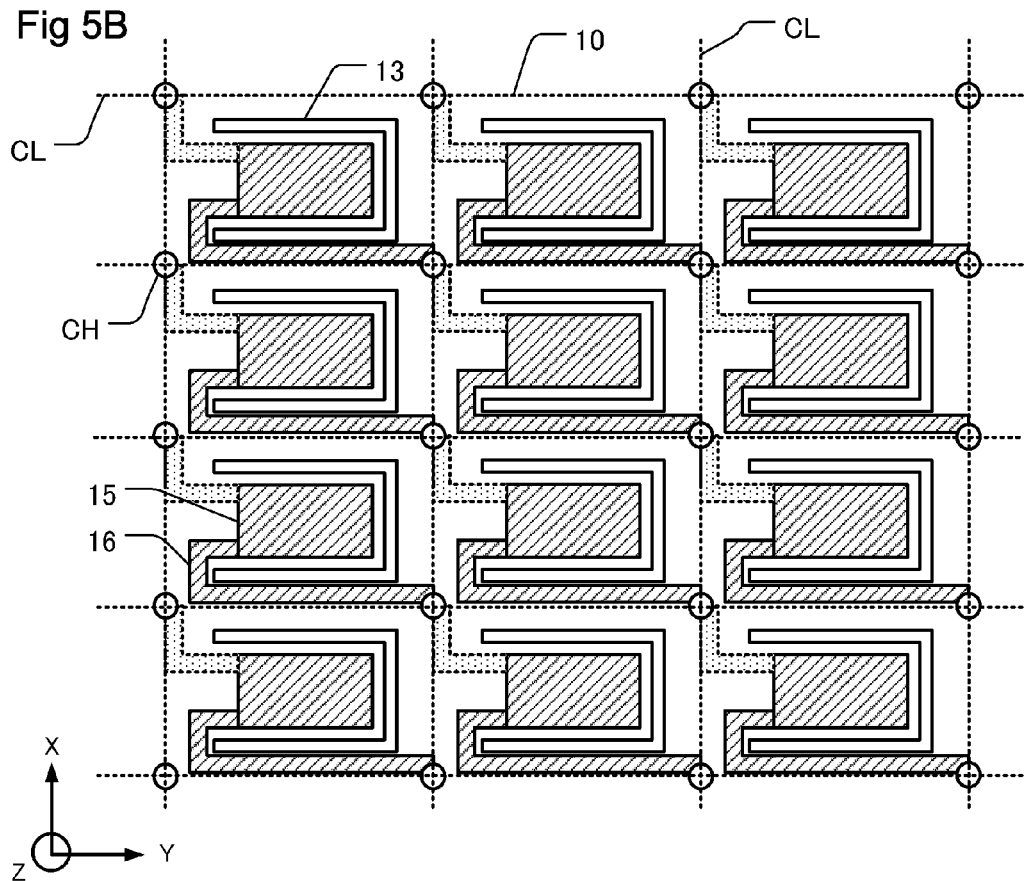

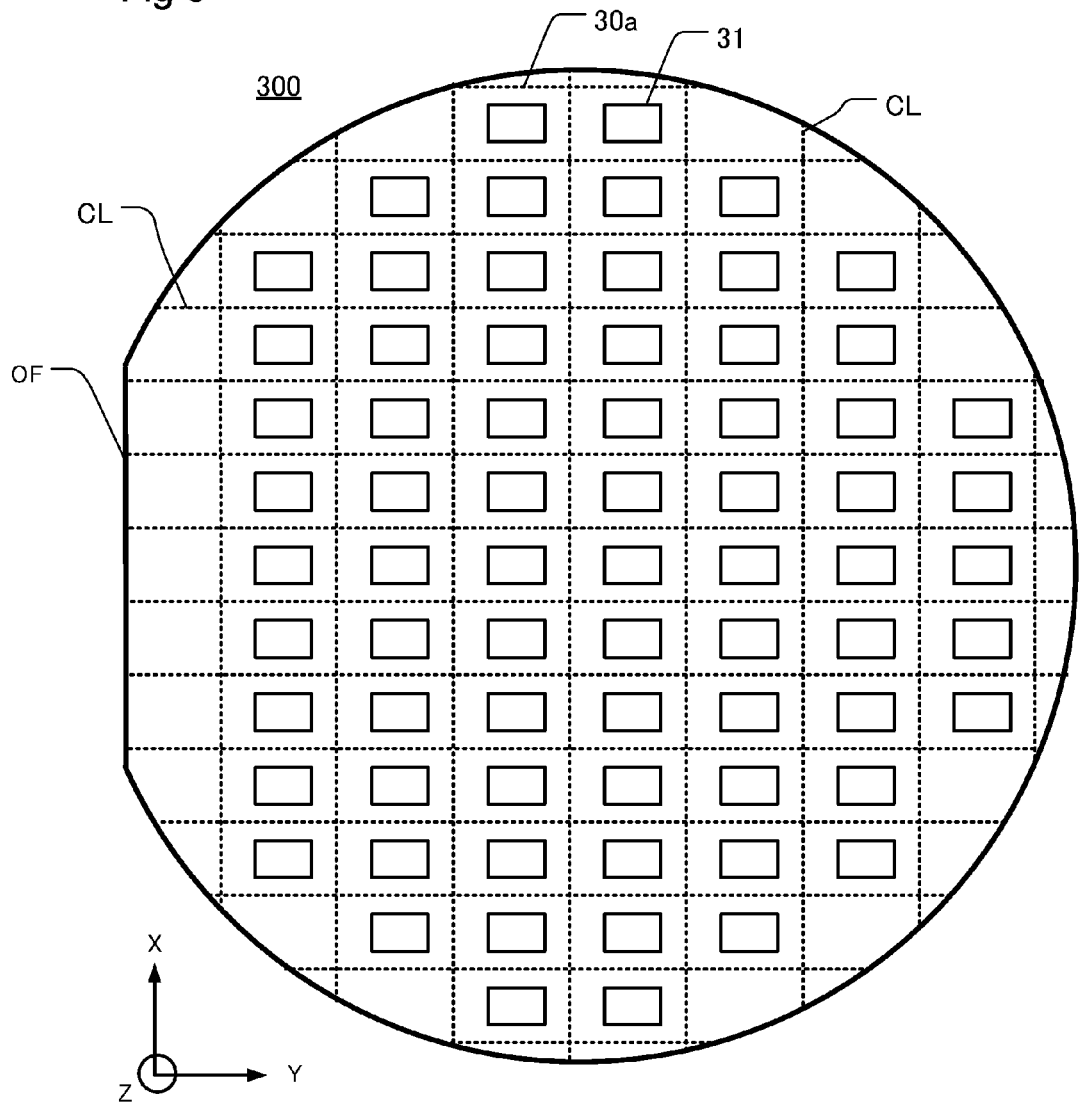

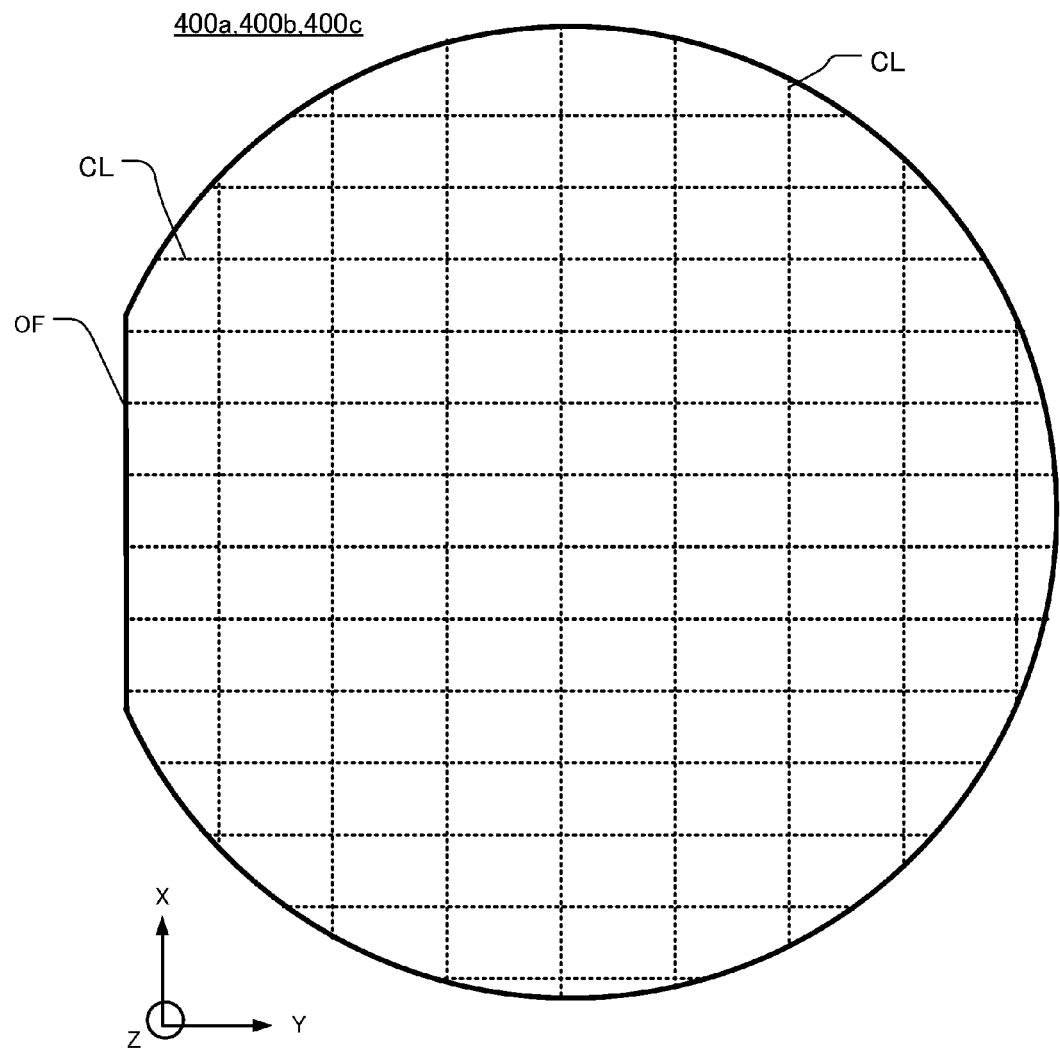

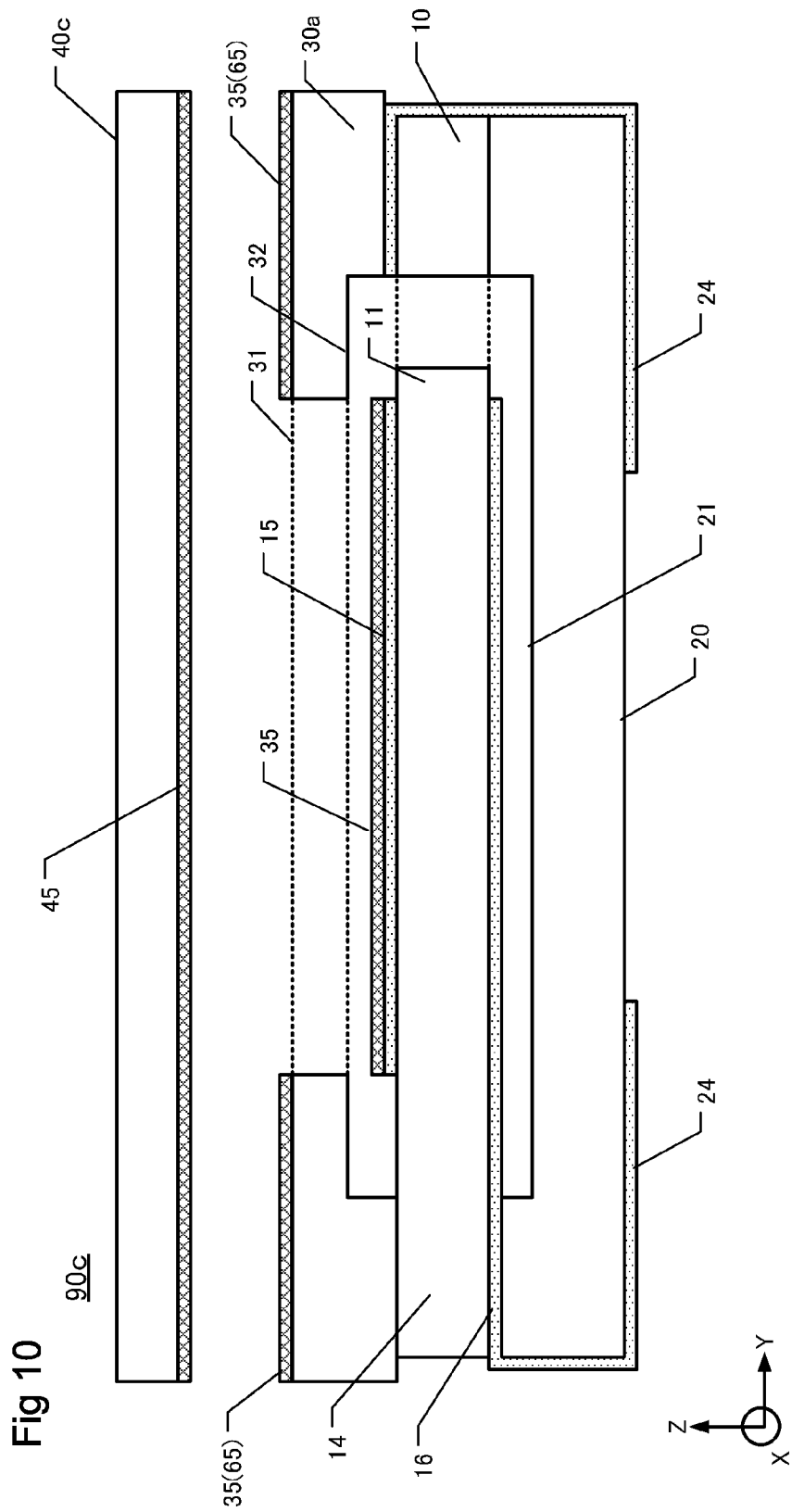

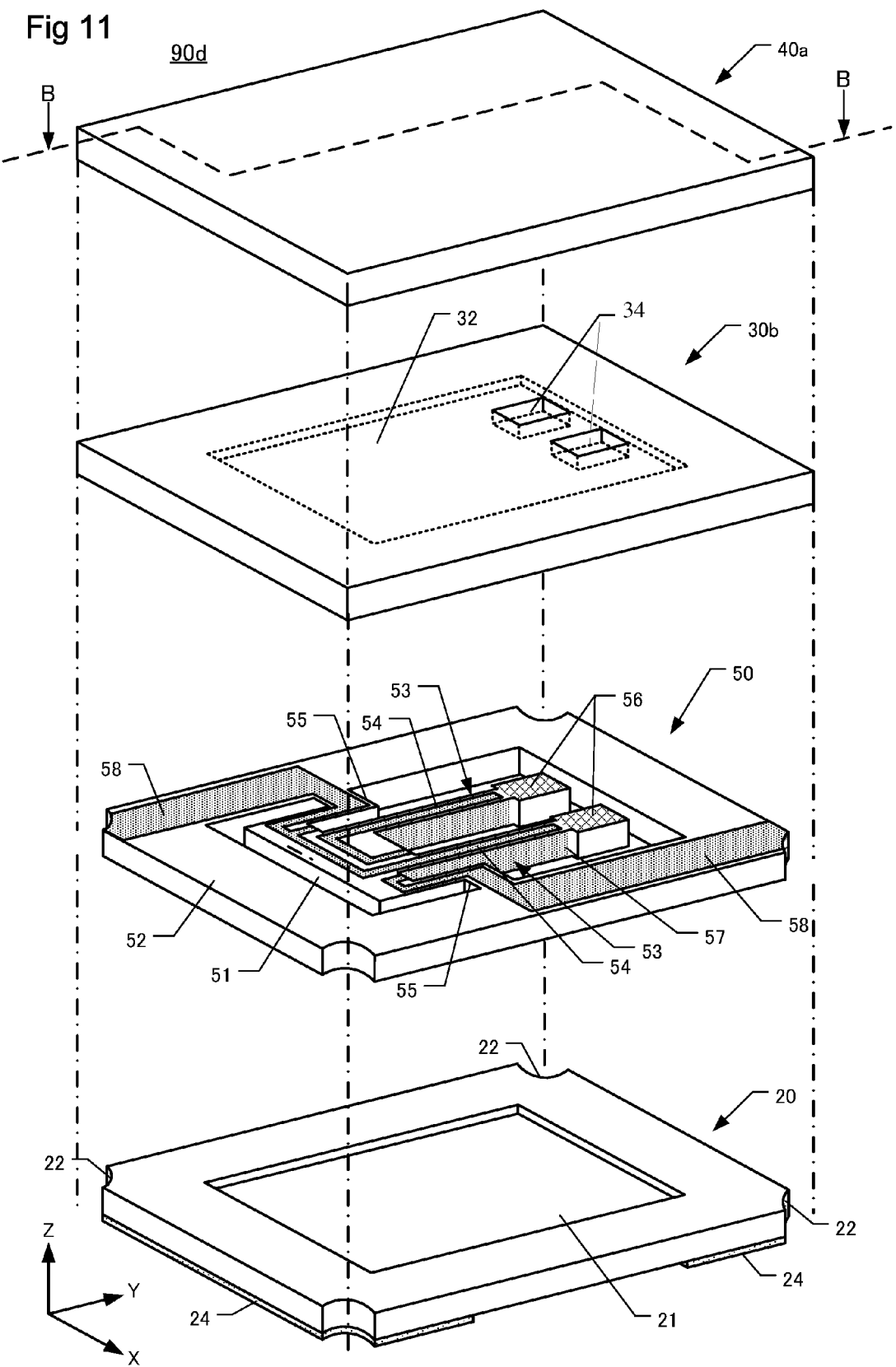

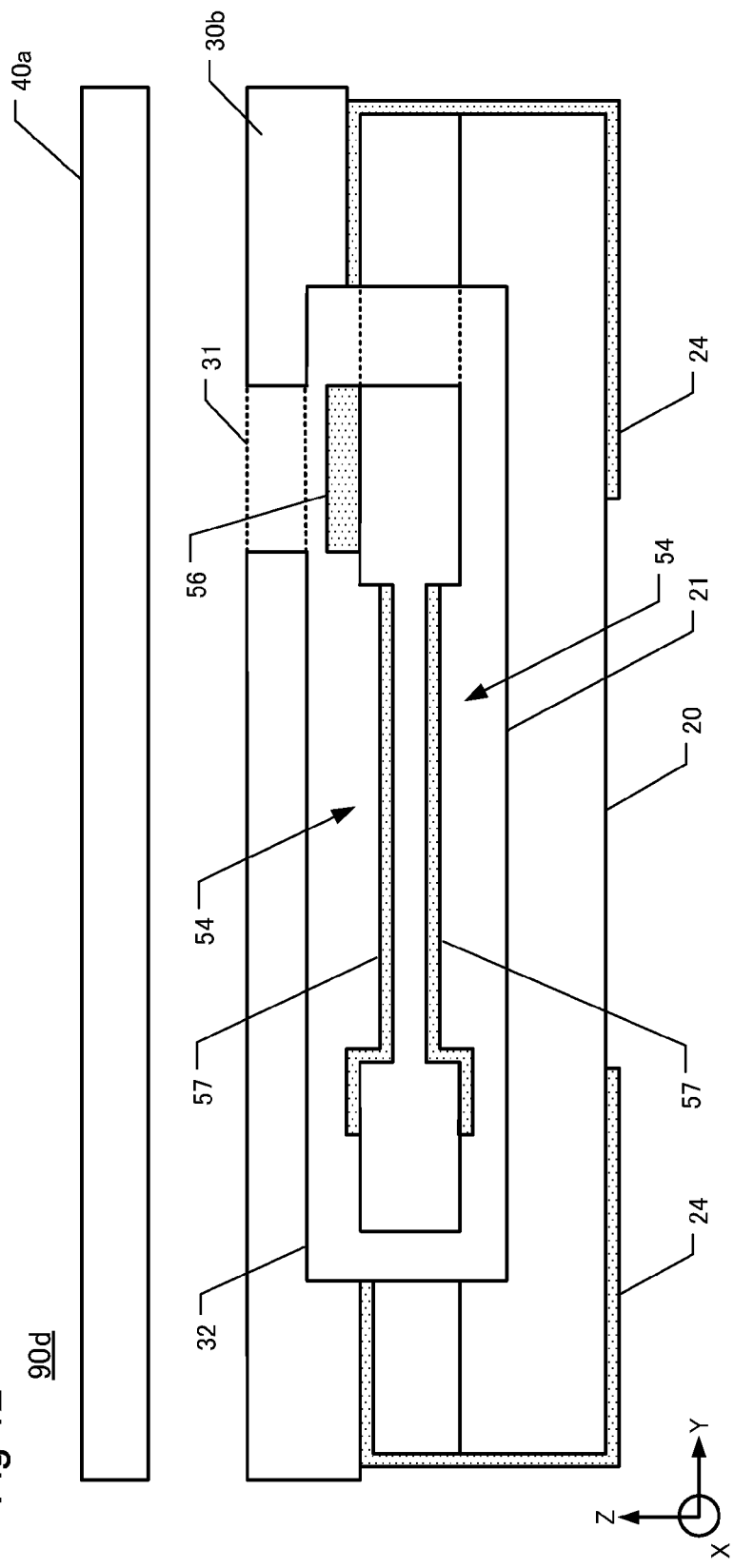

SURFACE-MOUNTABLE QUARTZ-CRYSTAL DEVICES AND METHODS FOR MANUFACTURING SAME

CROSS-REFERENCE TO RELATED APPLICATION

This application claims priority to and the benefit of Japan Patent Application No. 2010-080195 filed on Mar. 31, 2010, in the Japan Patent Office, the disclosure of which is incorporated herein by reference in its entirety.

FIELD

This disclosure relates to, inter alia, surface-mounted quartz-crystal devices of which the respective packages include lids and base plates made of crystal materials.

DESCRIPTION OF THE RELATED ART

At time of manufacture, crystal vibrating pieces that produce vibrations in the thickness-shear mode (e.g., AT-cut quartz-crystal vibrating pieces and devices) are made to produce resonant-vibration frequencies that are slightly higher than the nominal vibration frequencies in finished product. These vibrating pieces are generally "adjusted" to vibrate at their lower, nominal, vibration frequency by adding an "adjustment" metal film to the excitation electrodes while the resonance frequencies are being measured. This is done before the vibrating piece is enclosed within a "package" (at which time the vibrating piece becomes a vibrating "device"). After adjusting the vibration frequency, the vibrating piece is mounted in a package, which is sealed. Unfortunately, mounting a crystal vibrating piece in a package frequently causes an offset in the resonance vibration frequency produced by the vibrating piece. Relative to product specifications, this offset may be rather large due to electrical capacitance between the crystal vibrating piece and the package.

Japan Patent Publication No. 1998-284971 discusses a way in which to solve this problem. Specifically, quartz-crystal vibrating pieces disclosed in this reference are mounted in their respective packages, and electrodes are added via openings defined in the lid to reduce resonance frequencies. Then, the openings in the lid are sealed. A disadvantage of the methods disclosed in JP '971 is that each one of the openings formed in the lid must be individually covered and sealed, which increases production costs.

In view of the difficulties with conventional practice as summarized above, a purpose of this invention is to provide methods for manufacturing quartz-crystal devices at lower cost without compromising the ability of the devices to vibrate at accurate and precise resonance frequencies.

SUMMARY

In view of the foregoing, an object of this invention is to provide improved methods for manufacturing quartz-crystal vibrating devices comprising respective crystal vibrating pieces that exhibit stable vibrations.

According to a first aspect of the invention, methods are provided for manufacturing a quartz-crystal vibrating device that includes a crystal vibrating piece. An embodiment of such a method comprises providing four wafers. The first wafer is a crystal wafer defining multiple crystal vibrating pieces each having a surrounding frame and respective electrodes formed on both main surfaces of the crystal vibrating piece. The frame is coupled to and circumferentially surrounds the crystal vibrating piece. The second wafer is a base wafer defining multiple base plates that are bondable to a first bonding surface of respective frames on the crystal wafer. The third wafer is a first-lid wafer defining multiple first lids that are bondable to a second bonding surface of respective frames on the crystal wafer. Each first lid defines a void situated to register with the electrode on the respective crystal vibrating piece whenever the first lids are bonded to the second bonding surface. The fourth wafer is a second-lid wafer sized similarly to the first-lid wafer. The second-lid wafer defines multiple second lids that are bondable to respective first lids of on the first-lid wafer so as to cover and seal the respective voids. In the method the crystal wafer is registered with, sandwiched between, and bonded to the base wafer and first-lid wafer. At this stage the vibrational frequencies of the crystal vibrating pieces are measured, followed by adjustment (as required on each vibrating piece) of the thickness of the electrode. The adjustment is performed through the void to the electrode facing the void. Adjustment results in the vibrational frequencies being brought to within specification for the finished product. Then, the second-lid wafer is registered with and bonded to the upper surface of the first-lid wafer to form a wafer assembly containing multiple "packaged" crystal vibrating pieces, now called "crystal vibrating devices." The wafer assembly is cut along cut lines to separate the finished crystal vibrating devices into individual devices.

During adjustment of the vibration resonance frequency, the resonance frequency (initially higher than required) is reduced by adding metal film (e.g., by sputtering) to the electrode visible through the void. This metal film is called an "adjustment metal film." Alternatively, the resonance frequency (initially lower than required) is increased by removing metal from the electrode (e.g., by reverse-sputtering).

When the second-lid wafer is being bonded to the first-lid wafer, the bonding can be performed using an adjustment metal film previously formed on the upper surface of the first-lid wafer (i.e., on the surface of the first-lid wafer facing the second-lid wafer).

In the second bonding step, an adjustment metal film is bonded to the first lid wafer using an adjustment metal film formed on the first lid wafer on the main surface of the second lid wafer.

The first-lid wafer and second-lid wafer can be made of crystal material, in which event the second-lid wafer is bonded to the first-lid wafer by siloxane bonding. Performing this bonding is facilitated by the previously performed reverse-sputtering.

The provided crystal wafer can include an array of through-holes formed at respective positions corresponding to points at which cut lines cross each other. Hence, the through-holes are located substantially outside the frames. Similarly placed through-holes are formed at respective locations on the base wafer that register with the locations of respective through-holes on the crystal wafer. If these features are included, the method can further comprise a step in which external electrodes are formed on the outer surface of the base wafer. The external electrodes are formed by forming a conductive metal film to the inner surface of each through-hole and to respective locations on the outer (lower) surface of the base wafer. This step is performed between the step of bonding the first-lid wafer and the step of adjusting the vibration frequency.

In other embodiments, particularly directed to methods for manufacturing crystal vibrating devices that produce thickness-shear vibrations, respective electrodes are formed on both surfaces of the crystal wafer. In these devices the voids in the first lids have similar shape and size as the electrodes.

In yet other embodiments each crystal vibrating piece is a tuning-fork type crystal vibrating piece including a pair of vibrating arms. On the distal end of each vibrating arm is a respective "weight." In such pieces two voids are formed in the first lid, each having the same shape and area of the respective underlying weight.

According to another aspect, quartz-crystal devices are provided. An embodiment of such a device comprises a crystal frame including a crystal vibrating piece with electrodes being formed on both main surfaces thereof. A frame circumferentially surrounds the crystal vibrating piece. A base is affixed to one surface of the frame, and a first lid is affixed to the other surface of the frame. The device includes a first lid having an area sufficient to cover the crystal vibrating piece. The first lid defines a void registered with the electrode on the upward-facing surface of the crystal vibrating piece. Extending over the entire upper surface of the first lid is an adjustment metal film, which also covers the facing surface of the facing electrode. The device includes a second lid bonded to the first lid. The second lid has an area sufficient to cover the first lid including the void. In this embodiment the surface of the second lid facing the first lid (i.e., lower surface of the second lid) is bonded to an adjustment metal film initially applied to the upper surface of the first lid and through the void to the upper surface of the crystal vibrating piece.

The lower surface of second lid can also include a bonding-metal film, wherein the second lid is bonded to the first lid by bonding the bonding metal film on the second lid with the adjustment metal film on the first lid.

The second lid can be made of a glass containing metal ions, wherein the adjustment metal film on the first lid is bonded to the second lid (e.g., by anodic bonding).

Another embodiment of a quartz crystal device comprises a crystal frame including a crystal vibrating piece with respective electrodes formed on both main surfaces thereof and a frame circumferentially surrounding the crystal vibrating piece. A base is affixed to one main surface of the frame, and a first lid is affixed to the other main surface of the frame. The device includes a first lid having an area sufficient to cover the crystal vibrating piece. The first lid defines a void that is registered with the electrode on the crystal vibrating piece facing the void. The device also includes a second lid that is registered with and bonded to the first lid and that covers the void. Before the second lid is bonded, the upper surface of the electrode can be made thinner, e.g., by abrasion, followed by application of an adjustment metal film to the upper surface of the first lid, including through the void and to the upper surface of the electrode. The second lid is bonded to the adjustment metal film. If the first and second lids are made of crystal material, the first and second lids desirably are bonded together by siloxane bonding.

In other embodiments the lower surface of the second lid includes a respective bonding metal film extending at least around the void. Applied over the upper surface of the first lid is a respective bonding metal film that is thicker than the electrode formed earlier.

The electrodes are usually formed on respective surfaces of the crystal vibrating piece. If the crystal vibrating piece is configured to vibrate according to the thickness-shear mode, the voids 11 desirably have the same shape as of the electrodes on the vibrating piece.

In other embodiments the crystal vibrating pieces are configured as tuning-fork type crystal vibrating pieces, each comprising a pair of vibrating arms having respective "weights" on the distal ends thereof. In such embodiments the first lid desirably defines two voids each placed to align with a respective weight and each being dimensioned in the length and width dimensions similarly to the respective weight.

The various embodiments provide quartz crystal devices producing consistent, uniform vibrations at specification, while being manufactured at reduced cost.

BRIEF DESCRIPTION OF THE DRAWINGS

FIG. 5A is a plan view of an AT-cut crystal wafer comprising multiple individual crystal frames formed thereon.

FIG. 5B is an enlarged view of a region of the AT-cut crystal wafer, schematically depicting multiple AT-cut crystal vibrating pieces formed thereon.

FIG. 6 is a plan view of a first lid wafer on which multiple individual first lids are formed.

FIG. 7 is a plan view of a second lid wafer on which multiple individual second lids are formed.

FIG. 10 is a cross-sectional view of a crystal vibrating device according to a third embodiment, after completing adjustment of its vibration frequency.

FIG. 11 is an oblique exploded view of a crystal vibrating device according to a fourth embodiment.

FIG. 12 is a cross-sectional view of a crystal vibrating device according to the fourth embodiment, after completing adjustment of its vibration frequency.

DETAILED DESCRIPTION

The invention is described below in the context of representative embodiments, which are not intended to be limiting in any way.

First Embodiment of Crystal Vibrating Device

Figure 1:
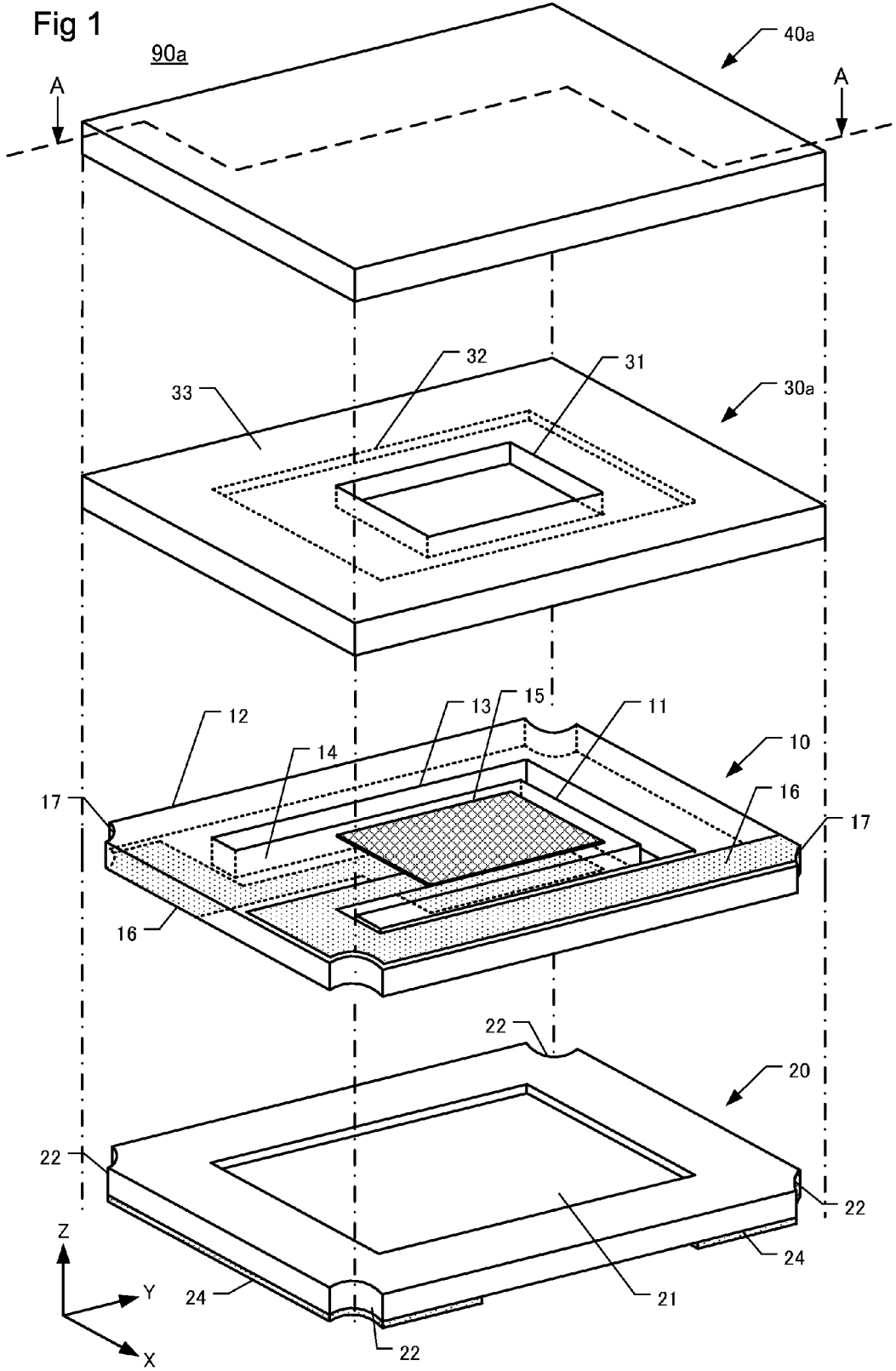
FIG. 1 is an oblique exploded view of a first embodiment of a crystal vibrating device.
Figure 2:
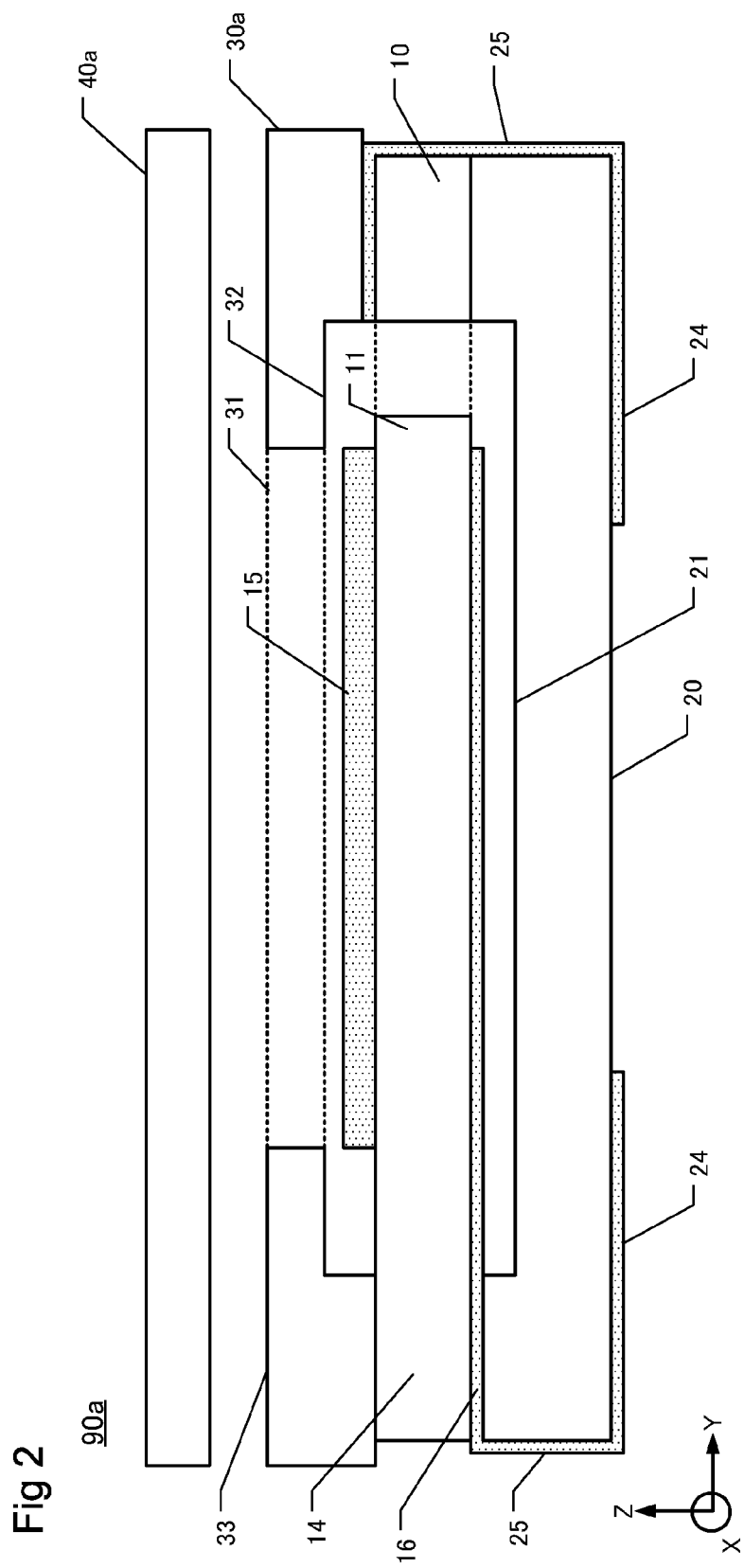
FIG. 2 is a cross-sectional view, along the line A-A in FIG. 1, of the first embodiment of a crystal vibrating device after completing adjustment of its vibration frequency.

This embodiment is an example of a crystal vibrating device 90a that vibrates in the thickness-shear mode. FIG. 1 is an oblique exploded view of the device 90a, which is configured as a surface-mountable device (SMD) and includes an AT-cut crystal frame 10. The single crystal frame 10 shown in the figure is one of a few hundreds to a few thousands of such frames that are formed simultaneously on an AT-cut "frame wafer." FIG. 2 is a cross-sectional view of the device 90a, along the line A-A in FIG. 1, after completing adjustment of its vibration frequency.

The crystal vibrating device 90a comprises a base plate 20, the AT-cut crystal frame 10, a first lid 30a, and a second lid 40a. The base plate 20 is fabricated of piezoelectric material, e.g., a piezoelectric crystal material such as quartz crystal. The base plate 20 includes an upper (inner) main surface (visible in FIG. 1) and a lower (outer) main surface, the latter also termed a "mounting surface." The inner main surface faces the crystal frame 10 and defines a concavity 21 having length and width dimensions (in the XY plane) that are larger than corresponding dimensions of the vibrating portion 11 described below. Formed on the lower main surface of the base plate 20 are external electrodes 24. Each of the four corners of the base plate 20 includes a respective quarter-circle cutout 22, each being a respective portion of a respective through-hole BH formed in a base wafer, discussed later below with reference to FIG. 4B. Conformably disposed in each cutout 22 is a respective connecting electrode 25 (see FIG. 2) formed simultaneously with formation of the external electrodes 24. Thus, the external electrodes 24 are electrically connected to the excitation electrodes 15 of the crystal frame 10.

The crystal frame 10, fabricated of AT-cut crystal material, comprises a vibrating portion 11 and a frame portion 12 that circumferentially surrounds the vibrating portion 11. Between the vibrating portion 11 and the frame portion 12 is a U-shaped through-channel (void) 13, which extends on three sides of the vibrating portion. The remaining side is occupied by a connecting portion 14 coupling the vibrating portion 11 to the frame portion 12.

A respective excitation electrode 15 is disposed on the upper main surface and lower main surface of the vibrating portion 11. Each excitation electrode 15 is connected to a respective extraction electrode 16 disposed on the respective main surface of the frame 12. In this embodiment the through-channel 13 provides clearance for the vibrating portion 11 on three sides thereof; however, this clearance is not required. Also, whereas the vibrating portion 11 is shown having a rectangular plan profile, it alternatively can have either a trapezoidal or an inverted trapezoidal profile.

The quarter-circle cutouts 17 on the corners of the crystal frame 10 are formed simultaneously with formation of the through-holes CH (discussed later below with reference to FIG. 5B). As noted, each quarter-circle cutout 17 includes a respective connecting electrode 25. The external electrodes 24 and the extraction electrodes 16 are electrically connected together via the connecting electrodes 25 on the crystal frame 10 and via respective quarter-circle cutouts 22 on the base plate 20.

Hence, whenever an alternating voltage signal is applied to the external electrodes 24, the signal is conducted to the excitation electrodes 15 to cause the vibrating portion 11 to vibrate at its designated fundamental frequency. The fundamental frequency of the crystal frame 10 is a function of several variables including the thickness of the AT-cut vibrating portion 11. The fundamental frequency also varies with corresponding changes in the thickness of the excitation electrodes 15. Hence, the vibration frequency of the crystal frame 10 can be minutely adjusted to a desired frequency by appropriately changing the thickness of the excitation electrodes 15. For example, the vibration frequency of the crystal vibrating device 90a is increased by making the excitation electrodes 15 thinner, and the vibration frequency is decreased by making the excitation electrodes thicker.

With respect to the crystal vibrating piece 90a of this first embodiment, the excitation electrodes 15 are initially formed thicker than ultimately desired (which causes the vibrating portion 11 to vibrate at a frequency slightly lower than desired). To increase the vibration frequency to within specification, the excitation electrodes 15 are thinned in situ by execution of a reverse sputtering step performed during the frequency-adjustment stage of the manufacturing process.

The first lid 30a is a rectangular piece of the crystal material. The first lid 30a defines a void 31 having the same size and shape as the adjacent excitation electrode 15 on the vibrating portion 11. Defined on the lower main surface of the first lid 30a is a concavity 32 that is disposed adjacent the upper main surface of the crystal frame 10. The concavity 32 is larger than the vibrating portion. On the lower main surface of the first lid 30a, the area that is peripheral to the concavity 32 is a lower bonding zone 33 for bonding the first lid 30a to the frame portion 12. On the upper main surface of the first lid 30a is a peripheral upper bonding zone 33 for bonding the second lid 40a to the first lid 30a.

The second lid 40a in this embodiment desirably is made of a rectangular unit of crystal material. The second lid 40a, when bonded to the upper bonding zone 33, seals the void 31.

Embodiment of Method for Manufacturing Crystal Vibrating Devices

Figure 3:
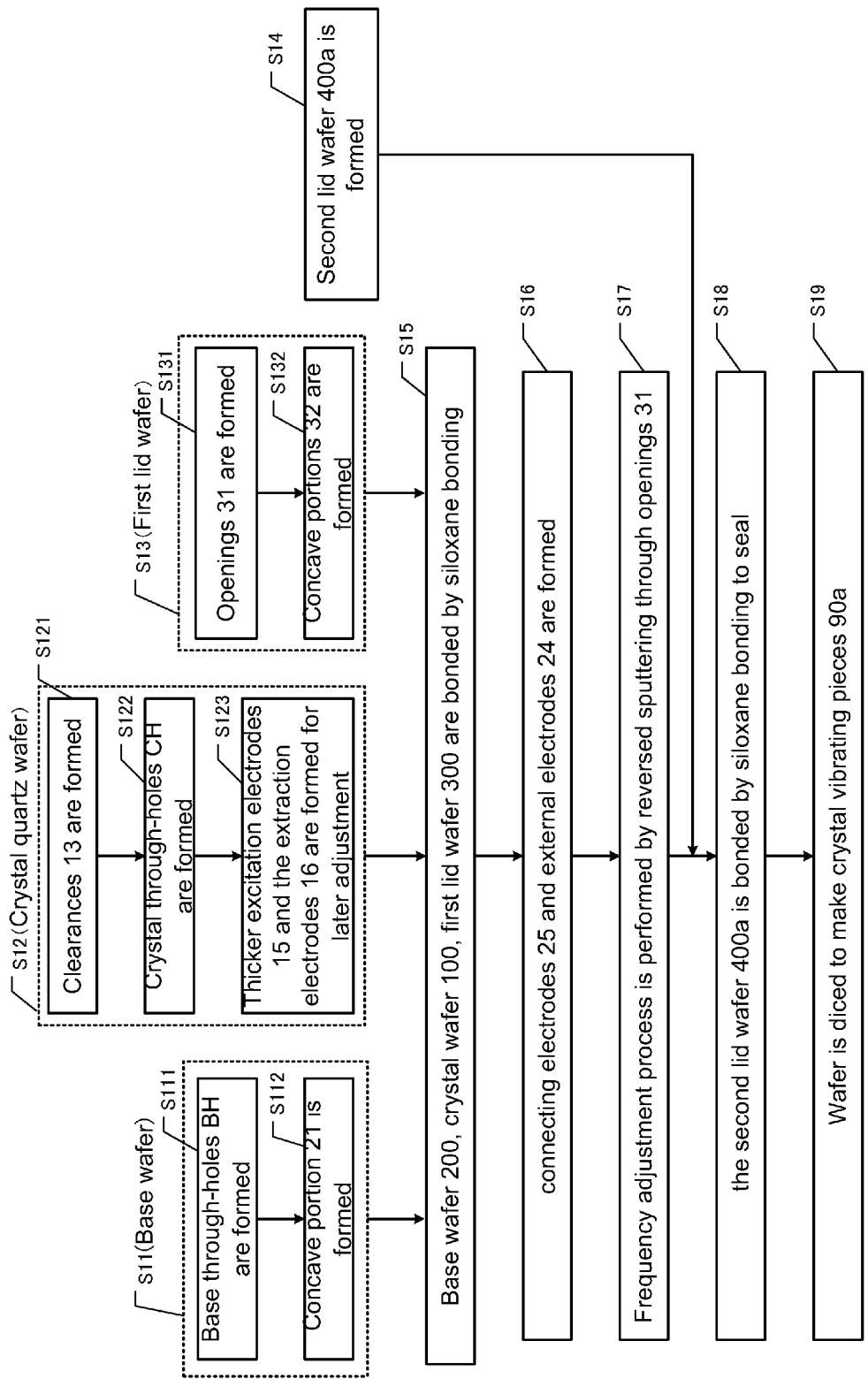
FIG. 3 is a flow-chart of an embodiment of a method for manufacturing crystal vibrating devices according to the first embodiment.

This method is appropriate for manufacturing crystal vibrating devices according to the first embodiment described above. An embodiment of this method is depicted in the flow-chart of FIG. 3. In step S11 a base wafer 200 is formed of a thin planar unit of crystal material.

In step S111 through-holes BH (see FIG. 4B) are formed in the base wafer 200 using conventional techniques including photolithography and etching. These through-holes BH are destined to become the quarter-circle cutouts 22. In step S112, concavities 21 are formed on the base wafer 200 in a similar manner using photolithography and etching. If the AT-cut crystal vibrating portions 11 are to have inverted trapezoidal shapes (in which the vibrating portions 11 are thinner than the respective frame portions 12), step S112 may not be necessary.

Figure 4A:
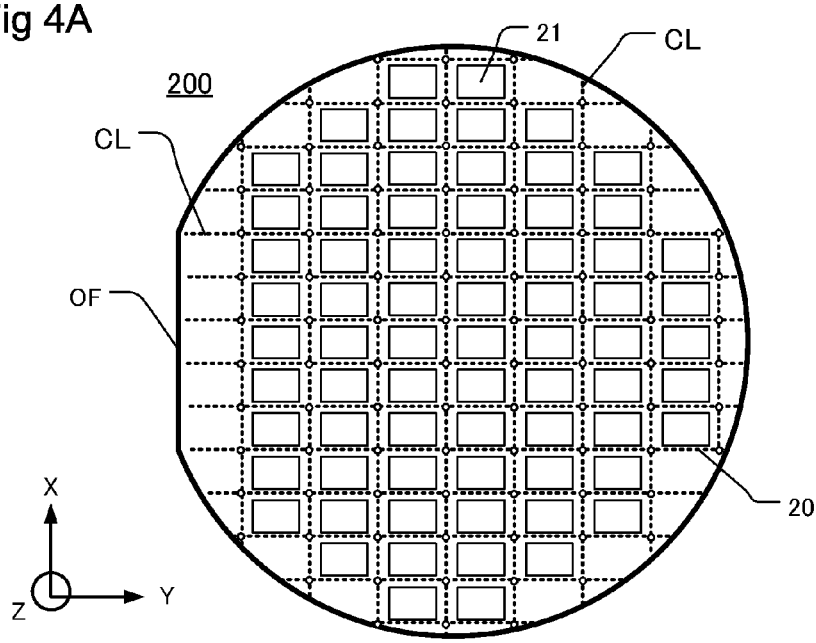
FIG. 4A is a plan view of a base wafer comprising multiple individual base plates formed thereon.
Figure 4B:
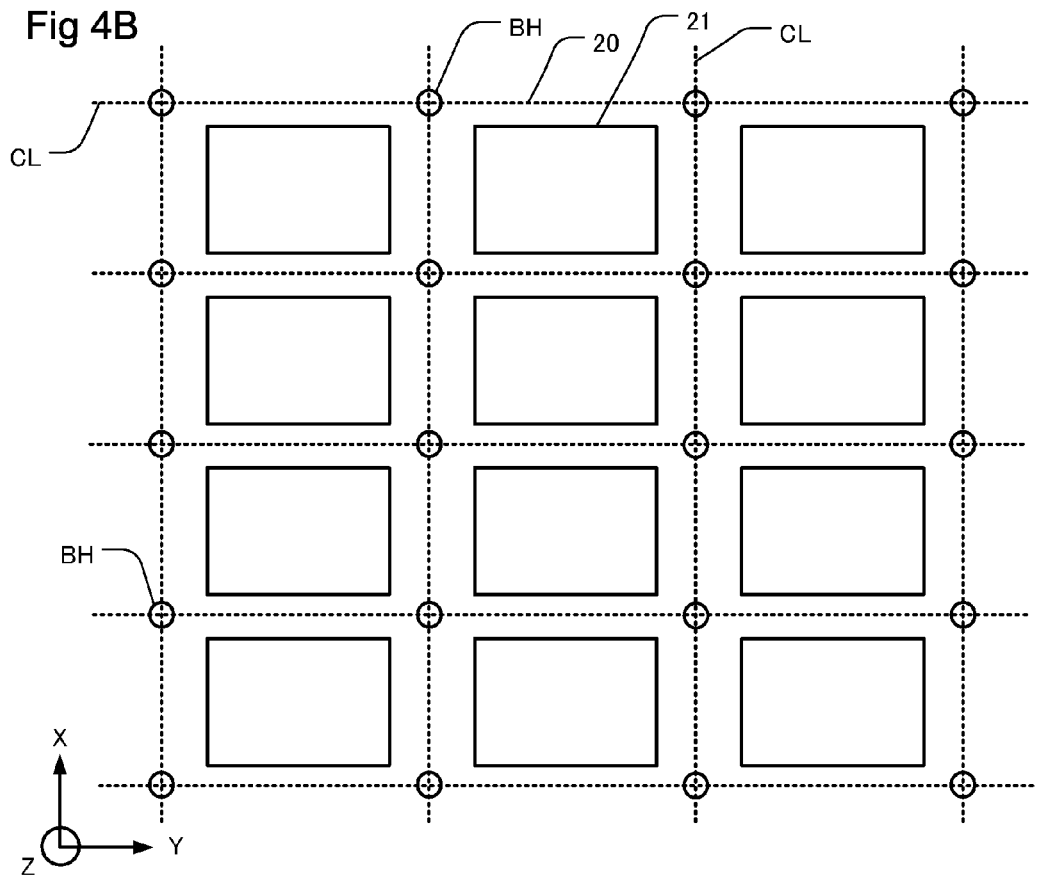
FIG. 4B is an enlarged view of a region of the base wafer, schematically depicting multiple base plates formed thereon.

FIGS. 4A and 4B are plan views of the upper main surface of the base wafer 200 formed in step S11. FIG. 4B is an enlargement of a region of base plates 20 formed on the base wafer 200. FIG. 4A shows an exemplary base wafer 200 made of a circular wafer of crystal material of which both major surfaces are planar to very tight tolerances. The base wafer 200 includes an orientation flat OF on a part of the peripheral edge thereof, wherein the flat OF provides a reference crystal orientation of the wafer. On a typical 3-4 inch diameter base wafer 200, a few hundred to a few thousand base plates 20 are formed simultaneously. Upon completing fabrication of the base plates 20, the base wafer 200 is cut up, as described later, along the cut lines CL to release all the individual base plates 20 from the base wafer 200.

As shown in FIG. 4B, circular through-holes BH are formed on the base wafer 200 at the corners of the cut lines CL. Since each through-hole BH circumscribes the four corners at the respective location on the base wafer 200, after cutting the corners of each base plate 20 have respective quarter-circle cutouts 22. Thus, each through-hole BH forms four quarter-circle cutouts 22. The base through-holes BH can be formed by photolithography and etching, or other suitable technique.

Returning to FIG. 3, step S12 involves forming the AT-cut quartz-crystal wafer 100. The resonance frequencies of the AT-cut crystal frame 10 to be formed on the AT-cut crystal wafer 100 are initially configured to be slightly lower than the desired frequencies. In step S121 the U-shaped through-channels 13 are formed in the crystal wafer 100. In step S122 circular through-holes CH (FIG. 5B) are formed on the crystal wafer 100 at the corners of the cut lines CL for cutting out crystal frames 10 from the crystal wafer 100. The through-channels 13 and the through-holes CH can be formed by photolithography and etching, or other suitable technique. In step S123, the excitation electrodes 15 and extraction electrodes 16 are formed simultaneously in each of the crystal frames 10 on the wafer 100 by the technique such as sputtering. The excitation electrodes 15, at least on the main surface facing the first lid 30a, are formed slightly thicker than ultimately required, to allow sufficient thickness for later adjustment by thinning. Thickness reduction (electrode thinning) is performed later by reverse sputtering at the frequency-adjustment stage.

FIGS. 5A and 5B are plan views of the AT-cut crystal wafer 100 formed in step S12. FIG. 5B is an enlarged view of a region of the surface of the wafer 100, showing fewer crystal frames 10. In FIG. 5A the AT-cut crystal wafer 100 is configured as a precisely planar plate. An orientation flat OF is provided to denote a specified crystal orientation of the wafer. On each crystal wafer 100 a few hundreds to a few thousands of crystal frames 10 are formed simultaneously. The outline profile of each crystal frame 10, when cut from the wafer 100 is established by the cut lines CL.

In FIG. 5B, on the crystal wafer 100, a few hundreds to a few thousands of U-shaped through-channels 13 (one for each crystal frame 10) are formed simultaneously with formation of the through-holes CH. On the crystal wafer the positions of the through-holes CH correspond to respective positions of corresponding through-holes BH of the base wafer 200.

During fabrication of the AT-cut crystal wafer 100, first a layer of chromium is formed on the surface of the wafer for use as a substrate for the excitation electrodes 15 and the extraction electrodes 16. A layer of gold is formed over the chromium layer. Formation of the gold layer is prefaced by formation of the chromium layer because gold adheres better to chromium than to piezoelectric crystal. Thus, the excitation electrodes 15 and extraction electrodes 16 can be formed with good conductivity and good adhesion to the crystal. The gold layer desirably is thicker than the chromium layer to make the initial resonance frequencies lower than the desired frequencies.

Returning to FIG. 3, Step S13 involves formation of the first-lid wafer 300. In step S131 the voids 31 are formed in the first-lid wafer 300 using photolithography and etching or other suitable technique. Each void 31 has the same size as the respective excitation electrodes 15 on the crystal frames 10. In step S132 the concavities 32 are formed on the first-lid wafer 300 by photolithography and etching. Step S132 is not always required if the vibrating portion 11 is shaped as an inverted trapezoid, wherein the vibrating portion 11 is thinner than the frame portion 12.

FIG. 6 is a plan view of the first-lid wafer 300 formed in step S13. The first-lid wafer 300 is fabricated of the crystal material and configured as a precisely planar wafer. The outline profile of each first lid 30a is defined by cut lines CL, as described later. The crystal orientation of the first-lid wafer is referenced to an orientation flat OF.

Returning to FIG. 3, in step S14 the second-lid wafer 400a is fabricated of the crystal material, and configured as a precisely planar wafer. Steps S11 to S14 can be performed simultaneously. FIG. 7 is a plan view of the second-lid wafer 400a formed in step S14. The outline profile of each second lid 40a is defined by cut lines CL, as described later. An orientation flat OF defines a reference crystal orientation.

Returning to FIG. 3, a first bonding step is performed in step S15, in which the base wafer 200 formed in step S11, the crystal wafer 100 formed in step S12, and the first-lid wafer 300 formed in step S13 (in this order) are lap-bonded together. In this step the orientation flats OF are used as respective lattice references for precise positioning of the wafers. The precision with which this first bonding step is performed enables the through-holes BH on the base wafer and the through-holes CH on the crystal wafer 100 to be accurately registered with each other.

Since all three wafers are made of crystal material, siloxane bonds are used for bonding them together. Siloxane bonding requires that two opposing (and clean) surfaces of crystal material be brought together and heated to approximately 200° C. while applying compression.

In step S16 the connecting electrodes 25 and external electrodes 24 are formed simultaneously by masking and sputtering. The external electrodes 24 are formed on the lower main surface of the base wafer 200 (after being bonded in step S15). The connecting electrodes 25 are formed on the walls of the aligned crystal through-holes CH and base through-holes BH previously formed on the crystal wafer 100 and base wafer 200. Electrode-related failures, including contact failures, open circuits, etc., between the external electrodes 24 formed on the base wafer 200 and the excitation electrodes formed on the crystal wafer 100 can be eliminated by forming the connecting electrodes 25 in the contiguously aligned through-holes CH and BH.

In step S17 vibration frequency is adjusted. This step is performed on all the crystal frames 10 on the crystal wafer 100 using reversed sputtering via the voids 31. Frequency adjustments are performed, after finishing the first bonding step and after forming all the electrodes, to every one of the AT-cut crystal frames 10 by applying respective voltages. For example, a train of alternating voltages is applied to the external electrodes 24 of the base wafer 200 under a vacuum. Then, each crystal frame 10 is vibrated to measure its vibration frequencies. The thickness of the excitation respective electrodes 15 is reduced, by reverse-sputtering, according to the measurements.

In this first embodiment, since each one of the AT-cut crystal frames 10 is initially configured to vibrate at lower frequencies, the desired frequencies are attained by increasing them. This is done by reverse-sputtering performed on the excitation electrodes 15 on the upper surface of the crystal frames 10. The frequency adjustment is performed on each and every one of the crystal frames 10 on the wafer. The first-lid wafer 300 is used as a mask for performing reverse-sputtering. The bonding zones 33 (except the voids 31) are cleaned to provide suitable conditions for the siloxane bonding involving the second-lid wafer 400a.

In step S18, a second bonding step is performed to seal the crystal vibrating devices 90a. For sealing, the second-lid wafer 400a (formed under a vacuum atmosphere) in step S14 is bonded to the upper main surface of the first-lid wafer to preserve the quality of the frequency-adjusted crystal frames 10. In this first embodiment, since the second-lid wafer 400a is made of the crystal material, the first-lid wafer 300 and the second-lid wafer 400a are bonded together by siloxane bonding after cleaning the bonding surfaces. Again, the orientation flats OF are used as references for positioning the second-lid wafer 400a precisely for siloxane bonding.

In step S19 the crystal vibrating devices 90a are separated from one another by a process called "dicing." Dicing can be performed using a laser, cutting blade, or other implement, and results in singulation of the crystal vibrating devices from one another. Thus, a few hundreds to a few thousands of individual crystal vibrating devices 90a are produced, each having a precisely adjusted vibration frequency.

After the base wafer 200, the crystal wafer 100 and the first-lid wafer 300 are bonded together, frequency adjustment is performed as in step S17. Therefore, the frequencies of the crystal vibrating pieces 90a will be substantially unchanged after steps S18 and S19.

Second Embodiment of Crystal Vibrating Device

A crystal vibrating device 90b according to this embodiment comprises a second lid made from a precisely planar second-lid wafer 400b having the same shape as the second-lid wafer 400a of the first embodiment. However, the material from which the second-lid wafer 400b is fabricated is different from the material of the second-lid wafer 400a of the first embodiment. Specifically, the second-lid wafer 400b is made of a glass material, such as Pyrex™ glass, borosilicate glass, or soda glass. These are all glasses that contain metal ions such as sodium ions. The description below covers the features of this embodiment that are different from the corresponding features in the first embodiment. In this second embodiment, components that are the same as corresponding components of the first embodiment have the same respective reference numerals and are not described further.

Figure 8:
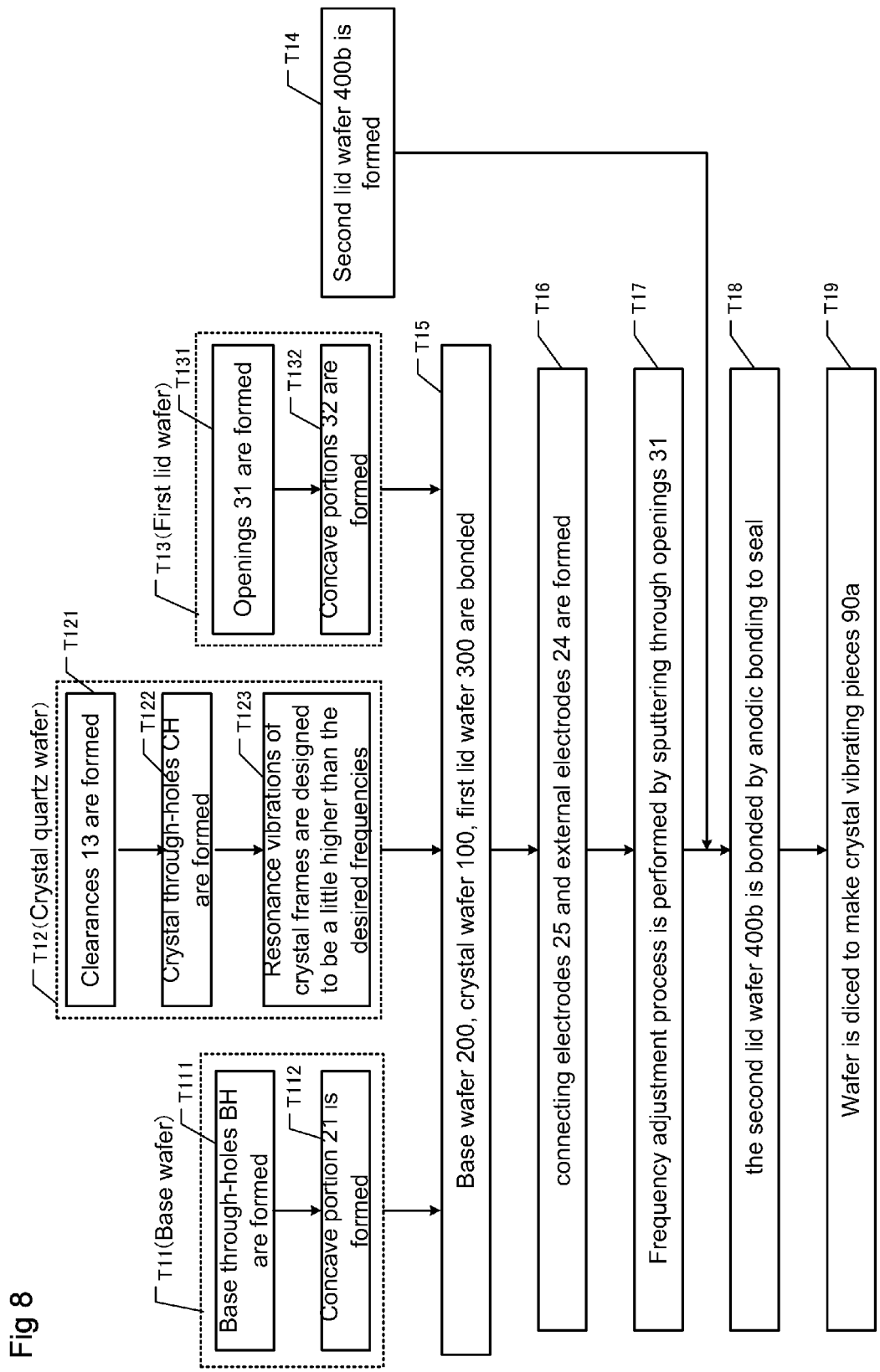
FIG. 8 is a flow-chart of method for manufacturing crystal vibrating devices according to the second embodiment.

FIG. 8 is a flow-chart of an embodiment of a method for fabricating the crystal vibrating devices 90b of this embodiment. The method depicted in FIG. 8 differs from the method shown in FIG. 3 in steps S123, S14, S17, and S18. Hence, the following description covers only these steps and includes steps T11 to T19 and corresponding steps T123, T14, T17, and T18 of FIG. 3.

In step T123, the AT-cut crystal frames 10 formed on the AT-cut crystal wafer 100 are configured to produce resonance oscillations that are slightly higher in frequency to the desired oscillation frequencies. In other words, assuming the excitation electrodes 15 are made thicker by sputtering at the frequency-adjustment stage, these electrodes are deliberately made thinner when initially formed. During deposition of the chromium and gold layers, the gold layer is initially made thinner than desired, which produces vibration frequencies that are a little higher than ultimately desired.

In step T14 the second-lid wafer 400b is formed of glass having a desired thickness.

In step T17 vibration frequency is adjusted. This step is performed simultaneously on all the crystal frames 10 on the frame wafer 10, and is performed by sputtering, using the voids 31 on the first-lid wafer 300 as a mask. Thus, an adjustment metal film 35 is formed on the upper surface of the excitation electrode 15 of each crystal frame 10, similar to the metal film formed on the bonding areas 33 of the first-lid wafer 300.

Figure 9:
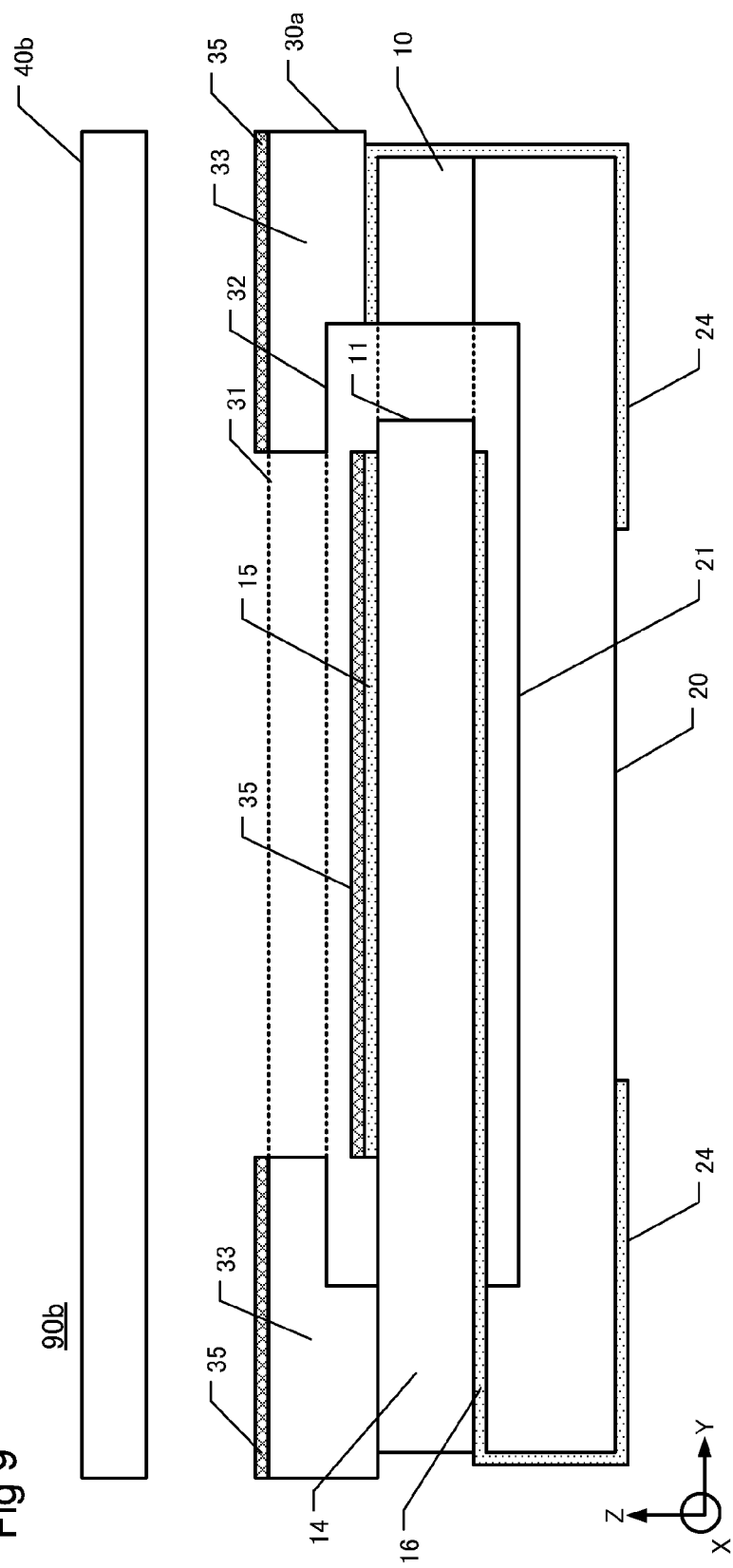
FIG. 9 is a cross-sectional view of a crystal vibrating device according to the second embodiment, after completing adjustment of its vibration frequency.

FIG. 9 is a cross-sectional view of the crystal vibrating device 90b after performing frequency adjustment. Since each crystal frame 10 is initially configured to vibrate at a frequency slightly higher than desired, frequency adjustment is performed by sputtering additional material onto the target regions, especially onto the upper surface of the vibrating portion 11. Adding this additional material (as an "adjustment metal film") to the upper excitation electrode 15 reduces the vibrational resonance frequency of the vibrating portion 11 to the desired level, as shown in FIG. 9.

The adjustment metal film 35 is either the chromium layer overlaid by the gold layer, the gold layer alone, or an aluminum layer alone. If frequency adjustment is unnecessary, or if only a small amount of the adjustment metal film 35 is required because the required adjustment is very small, sufficient metal film cannot be formed on the first-lid wafer 300. In such a situation, the adjustment metal film may be formed beforehand on the first-lid wafer 300 to be used for the second bonding step, described later. The chromium layer may be formed on the first-lid wafer 300 as a substrate for a subsequently applied gold layer formed by sputtering in the frequency-adjustment step.

In step T18 a second bonding step is performed to seal the crystal vibrating devices 90b. For sealing, the second-lid wafer 400b formed in step S14 is bonded in a vacuum atmosphere to the upper surface of the first-lid wafer 300 after the frequency-adjustment step has been completed (step T17). Bonding involves the adjustment metal film 35 that was formed in the bonding zones 33 on the upper surfaces of the first lids 30a and on the upper-surface excitation electrodes 15. The particular bonding method is anodic bonding that occurs between the adjustment metal film 35 in the bonding zones 33 and the lower surfaces of the second lids 40b.

Anodic bonding is an effective way to bond a metal to a glass containing metal ions, as in this embodiment. The metal (adjustment metal film 35) and glass (second lid) are placed in contact with each other in a heated vacuum environment or inert-gas atmosphere. Using the metal as an anode, a cathode is placed on the plane facing the bonding plane of the glass material. An electric field is impressed between the metal and the glass, which urges migration of the metal ions (e.g., sodium ions) from the glass to the cathode. As a result, the metal contacting the glass at the bond interface is oxidized and becomes bonded to the glass.

Third Embodiment of Crystal Vibrating Device

To produce crystal vibrating devices 90c according to this embodiment, a second-lid wafer 400c is used having the same shape as the second-lid wafer 400a used in the first embodiment. The second-lid wafer 400c is precisely planar, and can be made of any of various materials, including crystal, glass, or ceramic, on which a metal film can be formed.

Crystal vibrating devices according to this third embodiment can be manufactured using a method having many similarities to the method (FIG. 9) used for manufacturing crystal vibrating devices 90b according to the second embodiment. The only differences are in the bonding steps T14 and T18. Referring to FIG. 9 in the following description of the method according to the third embodiment, only the differences in these steps are described.

In step T14, the second-lid wafer 400c, made of crystal material, is formed having the desired thickness. As shown in FIG. 10, a first bonding metal film 45 is formed on the lower surface of the second-lid wafer 400c destined to be bonded to the upper surface of the first-lid wafer 300. FIG. 10 is a cross-sectional view of a crystal vibrating piece 90c after completion of frequency adjustment.

The first bonding metal film 45 is applied to the entire lower surface of the second-lid wafer 400c by sputtering or other suitable technique. (Alternatively, the first bonding metal film 45 can be applied only to those regions of the lower surface that correspond to the bonding zone 33, on the upper surface of the first-lid wafer 300, surrounding the void 31.) The first bonding metal film 45 is, for example, a gold layer or copper layer applied over a chromium layer.

If frequency adjustment is not required or if the amount of required adjustment is very small such that only a small amount of the metal film 45 is required, sufficient metal film 45 for bonding cannot be formed on the first-lid wafer 300. In such a case, sufficient metal film 45 for bonding purposes can be formed beforehand on the upper surface of the first-lid wafer 300. If the metal film 45 is gold or copper, a chromium layer may be formed beforehand on the upper surface of the first-lid wafer 300 to improve adhesion of the metal layer 45, especially since it is being used for bonding.

In step T18 the crystal vibrating pieces 90c are sealed inside their respective packages. For sealing, the second-lid wafer 400c formed in step S14 is bonded to the first-lid wafer in a manner that preserves the quality of the frequency-adjusted crystal frames 10. The first bonding metal film 45 on the second-lid wafer 400c and the adjustment metal film 35 (both either copper or gold) in the bonding zones 33 on the first-lid wafer 300 are bonded together using a conventional pressure-heating technique. The pressure-heating bonding technique is performed using a device that bond wafers together by melting the metal layers formed on the wafer surfaces in regions to be bonded together. First, the wafers are aligned with each other and then are subjected to pressure heating using the pressure-heating device. The pressure-heating device heats the wafers to a specified bonding temperature as the wafers are being compressed at a specified pressure for a specified length of time. Thus, the metal layers in contact with each other bond together, which in turn bonds the wafers together.

In the second and third embodiments, in step T123 the vibration frequencies of the AT-cut crystal frames 10 are initially a little higher than ultimately desired. In step T17 the frequencies are reduced by sputtering, as described earlier.

The frequencies of the AT-cut crystal frames 10 can be configured so that, during adjustment, the frequencies are first reduced slightly to below the ultimately desired frequencies in the same way as in the first embodiment, followed by reverse-sputtering to increase the frequencies. In such a case, in step T123 the resonance frequencies of the AT-cut crystal frames 10 formed on the crystal wafer 100 are configured to become a little lower than desired. For the frequency adjustment of these crystal frames 10, assuming the thickness of the excitation electrodes 15 is adjusted to be made thinner by reverse-sputtering at the frequency-adjustment stage, the excitation electrodes 15 are formed with sufficient thickness to allow performance of the required frequency adjustment. Therefore, the excitation electrodes 15 formed on the upper surface of the first-lid wafer 300 are configured to be initially thicker than their ultimate thickness.

In FIG. 10, when the first-lid wafer 300 is being formed in step T13, a second bonding metal film 65 is formed on the upper surface of the first-lid wafer 300. Since the second bonding metal film 65 is destined to be made thinner by reverse-sputtering in the frequency-adjustment step T123, the second bonding metal film 55 is initially formed at a thickness sufficient for performing frequency adjustment.

In the frequency-adjustment step T17, the vibration frequencies are adjusted in the same way as described in the first embodiment. Hence, frequency adjustment can be performed by reverse-sputtering in step T18, and the second bonding step S18 can be performed using the second bonding metal films 55 of sufficient thickness on the excitation electrodes of the crystal frames 10 and on the first-lid wafer 300. The second bonding step can be performed either by anodic bonding or by pressure heating, depending upon the materials of the bonding plane of the second-lid wafer 400.

Fourth Embodiment of Crystal Vibrating Device

Crystal vibrating devices 90d according to this fourth embodiment comprise tuning-fork type crystal vibrating frames 50 instead of the AT-cut crystal frames 10 used in the first, second, and third embodiments. FIG. 11 is an exploded oblique view of one of a few hundreds to a few thousands of crystal vibrating devices 90d normally formed on a crystal wafer. FIG. 12 is a cross-sectional view of a vibrating device along the line B-B in FIG. 11. A crystal vibrating device 90d in this embodiment comprises a tuning-fork type vibrating piece 50, a first lid 30b, and a second lid 40a.

The tuning-fork type vibrating devices 50 are made of a piezoelectric material. Each tuning-fork type vibrating frame 50 comprises a tuning-fork type vibrating portion 51 and a frame portion 52 circumferentially surrounding the tuning-fork type vibrating portion 51.

Each tuning-fork type vibrating portion 51 comprises a pair of vibrating arms 53, each having a respective groove 54 formed on each main surface of the vibrating arm 53. The tuning-fork type vibrating portion 51 is connected to the frame portion 52 by supporting arms 55.

The distal end of each vibrating arm 53 widens to form a respective "hammer-head." On these distal ends are "weights" 56 that can be trimmed to achieve adjustment of vibration frequency. The vibrating arms 53 are urged to vibrate whenever a voltage is applied to them. The vibrations are normally very stable. The weights 56 are metal films that can function either whenever an alternating voltage is applied or whenever voltage is not being applied.

After forming the outline profile of the tuning fork type vibrating portion 51, the grooves 54 are formed. The weights 56, excitation electrodes 57, and extraction electrodes 58 are formed simultaneously. The excitation electrodes 57 are formed on the vibrating arms 53, and the grooves 54 and extraction electrodes 58 are formed on both main surfaces of the frame portion 52.

On the first lid 30b, voids 34 are formed at respective positions corresponding to the positions of the weights 56 on the vibrating arms 53.

Adjusting the vibration frequency of this embodiment can be performed using a technique similar to that described in the first embodiment or the third embodiment. In general, frequency adjustment is performed by reducing the resonance oscillations of the crystal vibrating devices 90d. I.e., the thickness of each weight 56 is increased by sputtering occurring through the voids 34 on the first lid 30b. Frequency also can be adjusted by reducing the thicknesses of the weights 56 by reverse-sputtering occurring through the voids 34. If reverse-sputtering is used, the weights 56 need to be initially formed with sufficient thickness for use of this technique.

In the embodiments described above, the base wafer 200 or the first-lid wafer 300 may be formed using a material other than a crystal material, in which event the first bonding step must comprise a different bonding method.

In the fourth embodiment a circular mono-crystalline wafer is used. Alternatively, for example, a rectangular mono-crystalline wafer may be used.

It will be understood by persons of ordinary skill in the relevant art that the disclosed embodiments are exemplary but not limiting. The invention encompasses various alternatives, modifications, and equivalents that are within the spirit and scope of the invention, including alternatives, modifications, and equivalents of parametric ranges. Although this disclosure describes crystal vibrating devices, it will be understood that the disclosure also applies to, for example, quartz crystal oscillators comprising the subject crystal vibrating devices as well as at least one integrated circuit defining an appropriate oscillation-driving circuit.

Whereas the foregoing description is made with reference to AT-cut crystal vibrating devices, similar effects can be realized if BT-cut crystal vibrating devices are used. In addition, the shape of an excitation electrode is not limited to the rectangles with rounded corners discussed and shown herein. The shape can be modified variously. For example, the shape can be any of various polygons, such as a hexagon with rounded corners can be used.

Furthermore, the materials of which the excitation electrodes and extraction electrodes are made are not limited to the metals described above. Alternatively, aluminum (Al) can be used or an alloy of gold (Au) and silver (Ag), wherein the content of gold is 1 to 40% by weight.

What is claimed is:

1. A quartz-crystal device, comprising:
  a crystal vibrating piece having first and second main surfaces and including a vibrating portion with electrodes formed on both main surfaces thereof and a frame circumferentially surrounding the vibrating portion;
  a base affixed to the first main surface of the frame;

a first lid having first and second main surfaces and an area sufficient to cover the crystal vibrating piece, and the first lid defining a void registered with the electrode on the second main surface of the vibrating portion, the first main surface of the first lid being affixed to the second main surface of the frame; and a second lid being of a size of the second main surface of the first lid and the void combined, the second lid being bonded to an entire adjustment metal film on the area for sealing the void, wherein the adjustment metal film and the electrodes are not electrically connected.

2. The device of claim 1, wherein:

the second lid comprises a first bonding metal film, the first bonding metal film facing the second surface of the first lid and extending at least around the void; and the adjustment metal film is bonded to the first bonding metal film.

3. The device of claim 1, wherein:

the second lid is made of a glass containing metal ions; and the adjustment metal film on the second surface of the first lid is bonded to the second lid.

4. The device of claim 1, wherein:

the crystal vibrating piece has first and second main surfaces and includes a vibrating portion with electrodes formed on both main surfaces thereof, wherein the crystal vibrating piece vibrates according to a thickness-shear mode; and the void is shaped so as to have a size that is similar to the size of one of the electrodes of the crystal vibration piece.

5. The device of claim 1, wherein:

the vibrating portion is a tuning-fork type crystal vibrating piece including a pair of vibrating arms each having a distal-end weight;

the first lid defines two voids; and each void is shaped so as to have a size that is similar to the size of the corresponding weight.

6. The device of claim 2, wherein:

the crystal vibrating piece has first and second main surfaces and includes a vibrating portion with electrodes formed on both surfaces thereof, wherein the crystal vibrating piece vibrates according to a thickness-shear mode; and the void is shaped so as to have a size that is similar to the size of one of the electrodes of the crystal vibration piece.

7. The device of claim 3, wherein:

the crystal vibrating piece has first and second main surfaces and including a vibrating portion with electrodes formed on both surfaces thereof, wherein the crystal vibrating piece vibrates according to a thickness-shear mode; and the void is shaped so as to have a size that is similar to the size of one of the electrodes of the crystal vibration piece.

8. The device of claim 2, wherein:

the vibrating portion is a tuning-fork type crystal vibrating piece including a pair of vibrating arms each having a distal-end weight;

the first lid defines two voids; and each void is shaped so as to have a size that is similar to the size of the corresponding weight.

9. The device of claim 3, wherein:

the vibrating portion is a tuning-fork type crystal vibrating piece including a pair of vibrating aims each having a distal-end weight;

the first lid defines two voids; and each void is shaped so as to have a size that is similar to the size of the corresponding weight.

* * * * *